United States Patent
Shankar et al.

(10) Patent No.: US 7,554,390 B1
(45) Date of Patent: Jun. 30, 2009

(54) METHOD AND SYSTEM FOR TRANSITIONING BETWEEN OPERATION STATES IN AN OUTPUT SYSTEM

(75) Inventors: Asit Shankar, Murphy, TX (US); Klaus Krogsgaard, Lyngby (DK)

(73) Assignee: Texas Instruments Incorporated, Dallas, TX (US)

( * ) Notice: Subject to any disclaimer, the term of this patent is extended or adjusted under 35 U.S.C. 154(b) by 38 days.

(21) Appl. No.: 11/961,144

(22) Filed: Dec. 20, 2007

(51) Int. Cl.
*H03F 3/38* (2006.01)
(52) U.S. Cl. .................. 330/10; 330/251; 330/291; 330/51
(58) Field of Classification Search ............ 330/10, 330/251, 291, 51
See application file for complete search history.

(56) References Cited

U.S. PATENT DOCUMENTS

| | | | | |
|---|---|---|---|---|
| 5,128,629 A | * | 7/1992 | Trinh | 330/129 |
| 5,945,876 A | * | 8/1999 | Jones | 330/51 |
| 6,720,825 B2 | | 4/2004 | Hansen et al. | |
| 6,765,443 B2 | * | 7/2004 | Pehike | 330/296 |
| 6,998,910 B2 | * | 2/2006 | Hezar et al. | 330/10 |
| 7,230,481 B2 | | 6/2007 | Hansen et al. | |
| 7,262,658 B2 | | 8/2007 | Ramaswamy et al. | |
| 7,391,258 B2 | * | 6/2008 | Frederiksen et al. | 330/10 |
| 2005/0083115 A1 | | 4/2005 | Risbo | |

* cited by examiner

*Primary Examiner*—Patricia Nguyen
(74) *Attorney, Agent, or Firm*—John J. Patti; Wade J. Brady, III; Frederick J. Telecky, Jr.

(57) ABSTRACT

A closed loop amplifier system comprising a modulator that provides a pulse-width modulated (PWM) output signal based on an input signal, the modulator having a variable closed loop transfer function. The system also comprises a ramp generator that provides a ramp signal to the modulator, the variable closed loop transfer function of the modulator varying as a function of the ramp signal. The system further comprises a controller that controls the ramp generator to provide the ramp signal to adjust the variable closed loop transfer function during transitions between operating states of the amplifier system.

20 Claims, 8 Drawing Sheets

METHOD AND SYSTEM FOR TRANSITIONING BETWEEN OPERATION STATES IN AN OUTPUT SYSTEM

TECHNICAL FIELD

This invention relates to output systems, and more specifically, to systems and methods for transitioning between operation states in an output system.

BACKGROUND

Digital techniques for audio signal processing extend to the driving of audio output amplifiers. A popular class of amplifier circuits in many audio applications is "class D" amplifiers. A Class D amplifier drives a complementary output signal that is digital in nature, with the output voltage swinging fully from "rail-to-rail" at a duty cycle that varies with the audio information. Complementary metal-oxide-semiconductor (CMOS) output drive transistors are thus suitable for class D amplifiers; as such devices are capable of high, full-rail, switching rates such as desired for digital applications. CMOS drivers conduct low DC current, and their resulting efficiency is especially beneficial in portable and automotive audio applications. In addition, the ability to realize the audio output amplifier in CMOS enables integration of an audio output amplifier with other circuitry in the audio system, further improving efficiency and also reducing manufacturing costs of the system. This integration also provides performance benefits resulting from close device matching between the output devices and the upstream circuits, and from reduced signal attenuation.

As is known in the art, an undesirable effect of a transient signal can exist in the output of a class D amplifier. The transient signal can cause audible artifacts, such as a "click/pop" noise, an audible "humming" noise or a crunching sound. Typically, the transient signals occur when the class D amplifier changes states of operation, such as between an activated state (e.g., switching mode or steady state) and a deactivated state. Reduction (or elimination) of such undesirable transient signals is thusly needed.

SUMMARY

One aspect of the invention is related to a closed loop amplifier system comprising a modulator that provides a pulse-width modulated (PWM) output signal based on an input signal, the modulator having a variable closed loop transfer function. The system also comprises a ramp generator that provides a ramp signal to the modulator, the variable closed loop transfer function of the modulator varying as a function of the ramp signal. The system further comprises a controller that controls the ramp generator to provide the ramp signal to adjust the variable closed loop transfer function during transitions between operating states of the amplifier system.

Another aspect of the invention is related to a system for transitioning an operation state of a multi-channel system, the system comprising means for providing a ramp signal and means for controlling the means for providing the ramp signal. The system also comprises means for providing a plurality of pulse-width modulated (PWM) signals that includes a means for filtering according to a transfer function that varies as a function of the ramp signal, wherein each of the plurality of PWM signals includes a P-side signal and an N-side signal associated with a respective channel that varies based on an input signal and the ramp signal. The system further comprises means for amplifying the plurality of PWM signals and providing a feedback signal to the means for providing the plurality of PWM signals. The system still further comprises means for transitioning the means for providing the plurality of PWM signals between at least two operation states based at least in part upon the ramp signal.

Still another aspect of the invention is related to a method for transitioning between an activated output state and a deactivated output state of a modulator of an audio system. The method comprises monitoring a selection signal, the selection signal indicating a change in the output state of the modulator. The method also comprises varying a closed loop transfer function of the modulator as a function of the ramp signal in response to detecting the selection signal indicating the change in the output state of the modulator.

DETAILED DESCRIPTION

Figure 1:
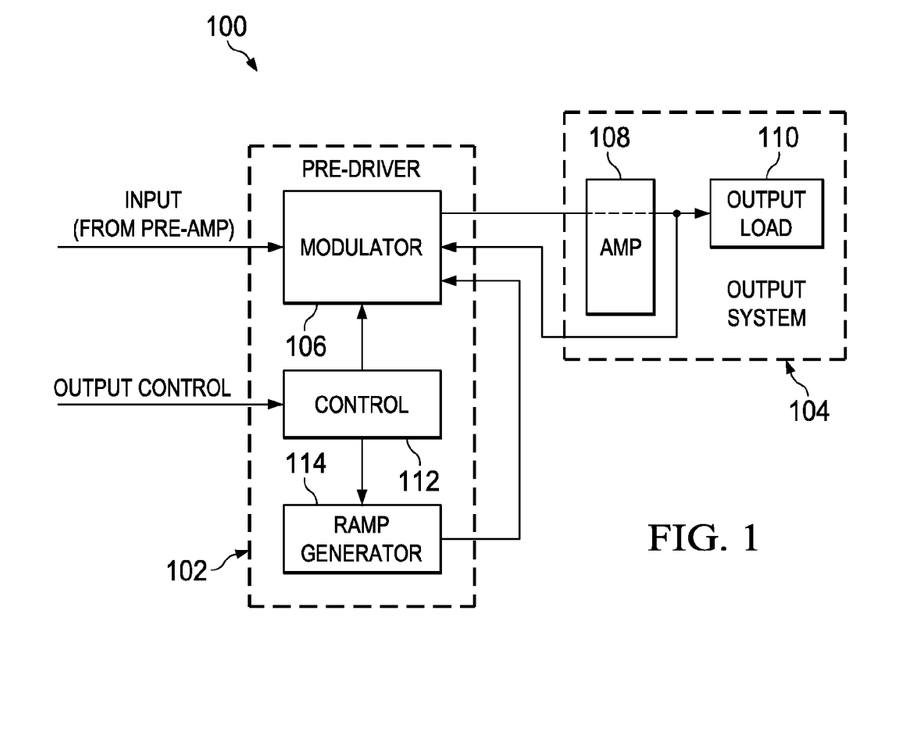
FIG. 1 illustrates an example of a system in accordance with an aspect of the invention.

FIG. 1 illustrates an example of a system 100 in accordance with an aspect of the invention. The system 100 could be implemented, for example, as an audio system (e.g., a stereo system, a surround sound system, etc.). Alternatively, the system 100 could be implemented as a motor control system. Those skilled in the art will appreciate other uses (e.g., for the system 100).

The system 100 includes a pre-driver 102 communicatively coupled to an output system 104. The pre-driver 102 could be implemented, for example, as hardware, software or a combination thereof. The pre-driver 102 can include a modulator 106 that can provide a pulse-width modulated (PWM) signal to an amplifier 108 of the output system 104. The modulator 106 could be implemented, for example, as a modulator that includes a second order, two pole filter system having an associated closed loop transfer function. The second order two pole filter system can include, for example, a first stage and second stage connected in series that respectively define first and second poles of the second order, two pole filter system. Each of the first and second stages of the modulator 106 could be implemented, for example, as filters with an adjustable gain and phase margin. The amplifier 108 can employ the PWM signal, for example, to drive an output load 110. The amplifier 108 can include PWM control logic.

As an example, the PWM control logic can control the minimum pulse-width of signals provided by the amplifier 108. The output load 110 could be implemented, for example, as one or more loudspeakers or one or more electric motors. Additionally, the signal provided by the amplifier 108 can be fed back to the modulator 106, thereby forming a closed loop system.

The modulator 106 can receive an INPUT signal. The INPUT signal could be provided, for example, from a preamplifier as an analog audio signal. The modulator 106 can modulate the INPUT signal to provide the PWM signal. A control 112 can be communicatively coupled to the modulator 106. The control 112 can be configured to activate and deactivate the modulator 106. In the activated state, the PWM signal provided from the modulator 106 can be implemented as a PWM version of the INPUT signal. In the deactivated state, the PWM signal is disabled. As an example, the control 112 can receive an OUTPUT CONTROL signal that causes the control 112 to change the operation state of the modulator 106. The OUTPUT CONTROL could be implemented, for example, as an activate/deactivate (e.g., start up, shut down) signal and/or as a mute/unmute signal.

The pre-driver 102 can also include a ramp generator 114 that can be communicatively coupled to the control 112. The control 112 can control the ramp generator 114 to provide a ramp signal to the modulator 106 at or about the same time that the control 112 causes the modulator 106 to change operation states.

The ramp signal can be employed by the modulator 106 to smooth the transition from an activated state to a deactivated state and vice versa. By way of further example in one implementation, the first stage of the modulator 106 could define a dominant pole of the second order, two pole filter system (e.g., the first pole) in the activated state of operation. In such an implementation, the ramp signal can be employed to vary the gain and/or the phase margin of at least one stage of the modulator 106 such that the second stage of the modulator 106 defines the dominant pole in the deactivated state of operation, thereby varying the transfer function associated with the second order, two pole filter system. It is to be understood that a dominant pole of a multiple pole filter system is the pole with a greater gain and/or phase margin than the non-dominant pole or poles. Thusly, the ramp signal can smooth transitions between the activated state and the deactivated state of operation. Such a smoothing of the transition can reduce or eliminate transient signals provided to the output system 104 that can damage electrical components and/or cause the system 100 to produce undesirable audible artifacts (e.g., a "click/pop" sound) if the system 100 is implemented as an audio system.

Figure 2:
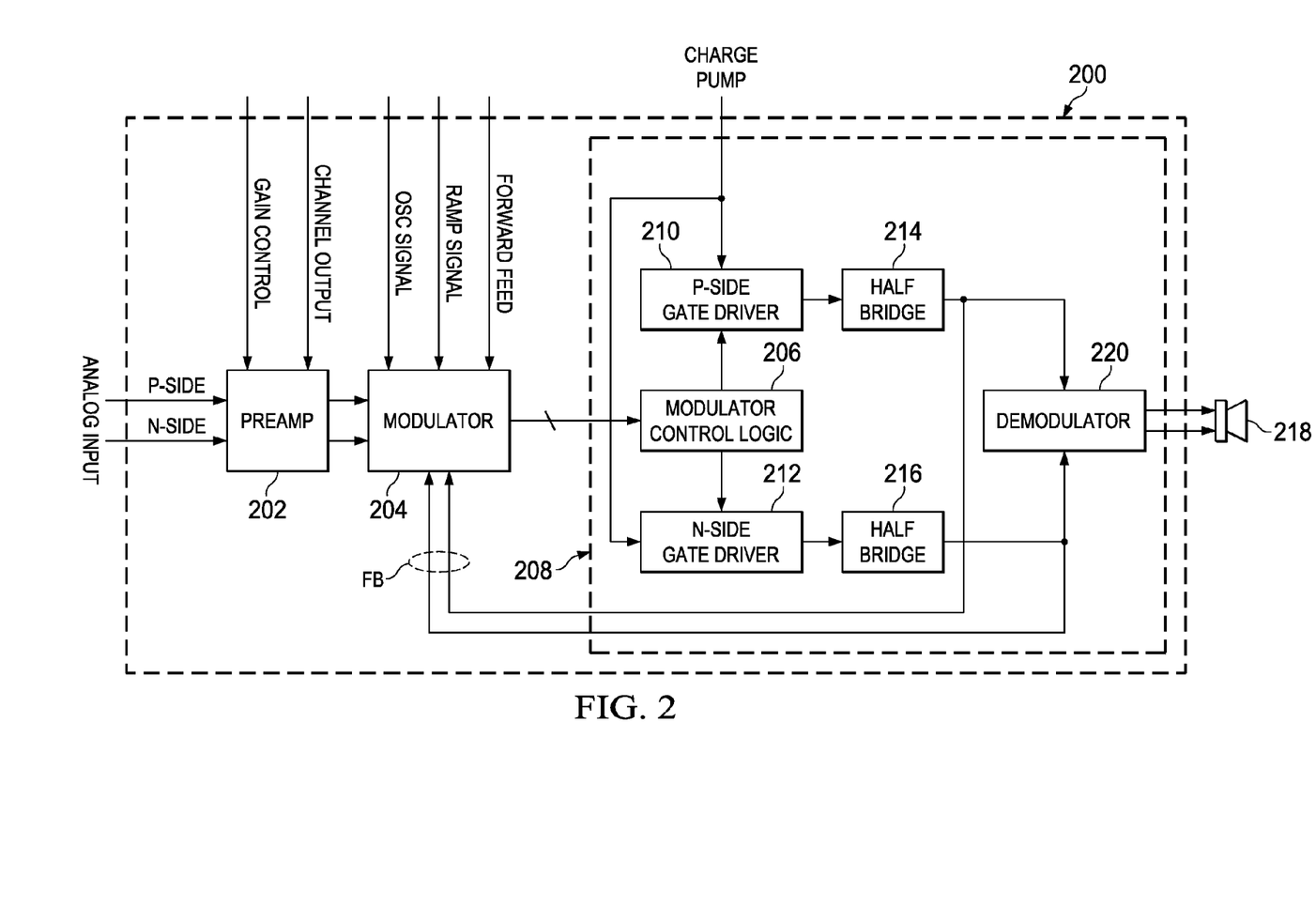
FIG. 2 illustrates an example of an audio channel in accordance with an aspect of the invention.

FIG. 2 illustrates an example of an audio channel 200 in accordance with an aspect of the invention. Differential analog input signals P-SIDE and N-SIDE can be received at a preamplifier 202. Although for purposes of simplification of explanation, the audio channel 200 is illustrated to be implemented as a differential audio channel 200, it is to be understood that the audio channel 200 could alternatively be implemented in a single-ended fashion, in which case the analog audio input signal would be a single-ended signal.

The preamplifier 202 amplifies the analog input signals (P-SIDE and N-SIDE) to an appropriate level for a modulator 204. The appropriate level can be set by a GAIN CONTROL signal (e.g., volume control) that can be provided to the audio channel 200, for example, in response to a user input. Alternatively, the GAIN CONTROL could be controlled by an autonomous system, such as a computer. As an example, the GAIN CONTROL can set the volume to zero (or near zero) when a deactivated state is selected, and the appropriate level when the activated state is selected. To adjust an output volume, the GAIN CONTROL signals gate the output of the preamplifier 202 to the desired volume output in an activated and/or unmuted condition. The preamplifier 202 can also receive a CHANNEL OUTPUT signal that indicates an operation state of the channel 200. The operation state of the channel 200 can transition between an activated state (e.g., start up or unmuted state) and a deactivated state (e.g., shut down or muted state).

The output of the preamplifier 202 can be provided to the modulator 204, along with a pair of feedback signals indicated at FB. The modulator 204 can receive a reference waveform OSC, for example, from a local oscillator in a power circuit. The modulator 204 can employ the OSC signal to generate a pulse-width-modulated version of the analog input signals. Also, in the present example, the modulator 204 can receive a RAMP signal, for example, from a ramp generator. The RAMP signal can be implemented as a differential non-zero voltage during deactivated (e.g., muted) periods, and can be implemented as a differential ramped common mode voltage in transient periods following activating and deactivating events (e.g., start up/shut down and/or muting/unmuting events). The modulator 204 also receives a power supply level signal (FWD FEED). The FWD FEED signal could be provided, for example, by a power supply feed-forward circuit.

The modulator 204 can generate and provide the PWM output to a modulator control logic 206 of an output amplifier 208. The modulator control logic 206 can modify the PWM output from the modulator 204 in response to certain events. For instance, the modulator control logic 206 could be configured to enforce certain minimum pulse widths for both "on" and "off" pulses during the transient periods following a mute or unmute of the audio output and/or a start up or shut down of the audio output in which the RAMP signal controls the duty cycle of the PWM output, thus ensuring stable operation of the associated channel. The audio output channel 200 can provide means for providing PWM signals that includes a means for filtering according to a transfer function that varies as a function of a ramp signal.

In one example, in which the output amplifier 208 operates as a class D amplifier, the modulator control logic 206 can provide complementary output signals to P and N-side gate drivers 210 and 212, respectively, of the output amplifier 208 to drive gates of transistors in first and second half-bridges 214 and 216, respectively of the output amplifier 208. The P-side and N-side high-side gate drivers, 210 and 212 are supplied by a CHARGE PUMP voltage. The P-side and N-side half bridges 214 and 216 can each include power output transistors that can drive a loudspeaker 218 of the channel 200 in response to the PWM output signal provided at the P-side and N-side half bridges 214 and 216. A demodulator 220 can be connected between the P-side and N-side half bridges 214 and 216 and the loudspeaker 218 to demodulate the signals provide by the P-side and N-side half bridges 214 and 216. The demodulator 220 could be implemented, for example, as an LC low pass filter with a cutoff frequency of about 40 kHz. Each of the P-side and N-side half-bridges 214 and 216 can receive complementary output signals from the modulator control logic 206, so that the high-side transistor of the P-side half-bridge 214 and the low-side transistor of the N-side half-bridge 216 are on (e.g., in a linear state) when the low-side transistor of the P-side half-bridge 214 and the high-side transistor of the N-side half-bridge 216 are off (e.g., in a cutoff state), and vice versa. In such an implementation, the loudspeaker 218 is driven as a bridged load, for example, in a class D manner. The signals driven by P-side and N-side half-bridges 214 and 216 can be fed back to the modulator 204 to provide the above-mentioned feedback signal indicated at FB. The output amplifier 208 can thusly provide means for amplifying PWM signals and for providing a feedback signal to a means for providing PWM signals.

Figure 3:
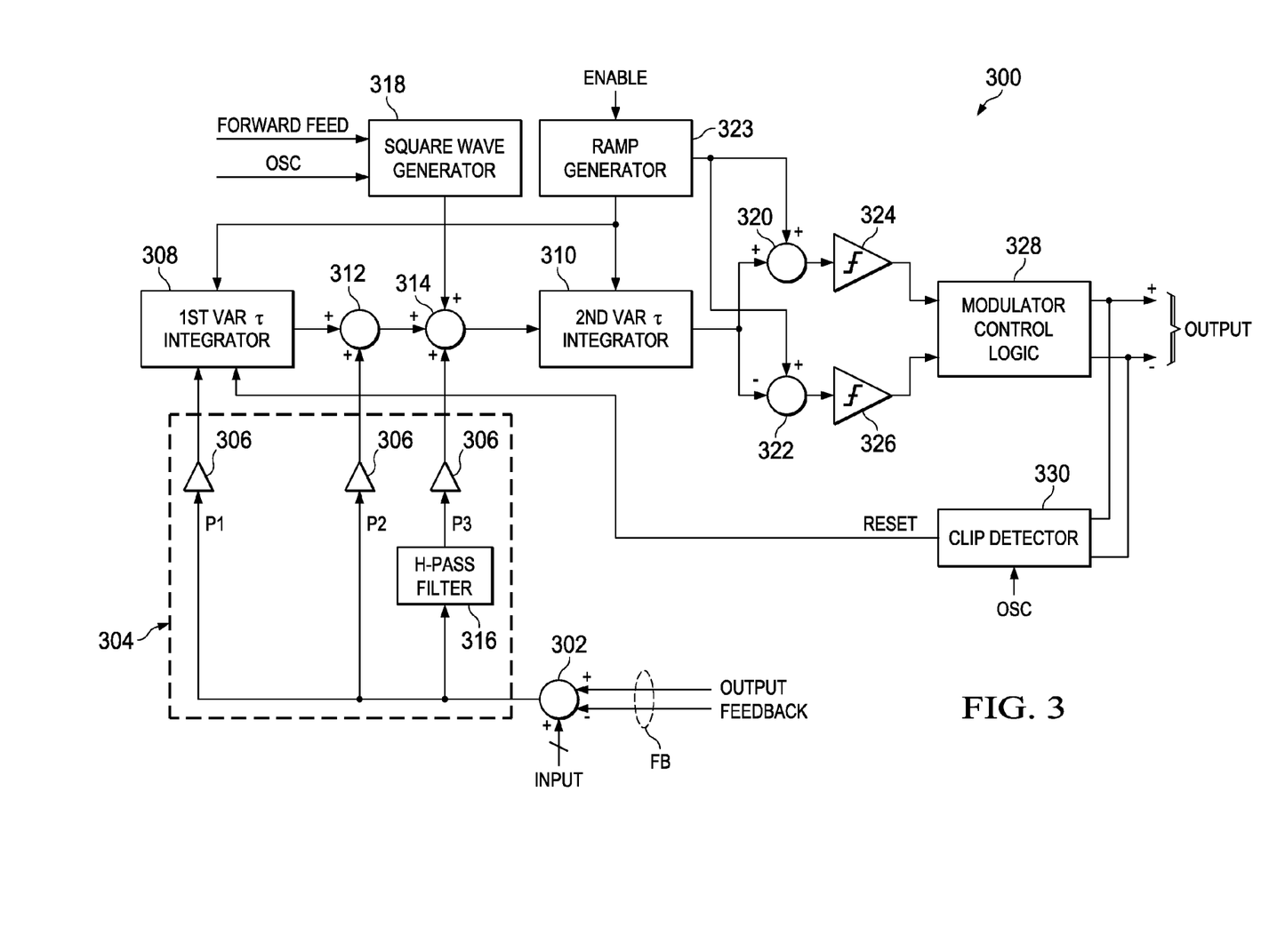
FIG. 3 illustrates an example of a modulator in accordance with an aspect of the invention.

FIG. 3 illustrates an example of a modulator 300 in accordance with an aspect of the invention. The modulator could be implemented, for example, as the modulator 204 illustrated in FIG. 2. An analog input signal (INPUT) can be received at a first adder 302. The analog input signal could be implemented, for example, as a differential audio signal. The first adder 302 can also receive a feedback signal indicated at FB, which feedback signal could be provided from one or more half-bridges of an amplifier (e.g., FIG. 7). For instance, the FB signal could be provided to the first adder 302 in the form of a differential voltage that could be provided from the half-bridges, such as in the form of a differential voltage driven across an output load (e.g., a loudspeaker). It is to be understood that the FB signal can be provided to the adder 302 via a differential gain block, having a gain of less than about one (e.g., unity). The output of the first adder 302, which output can correspond to a difference between the INPUT and the FB signal, can be applied to a loop filter. A loop filter block 304 can, for example, apply filters and gains 306 to the difference signal provided by the first adder 302. The loop filter can include at least one loop path, indicated at P1 with a transfer function of second order (or higher). In the present example, the loop filter can be implemented as a triple path loop (indicated at P1, P2 and P3) involving the combination of the loop filter block 304 with first and second variable time constant integrators 308 and 310. As such, the loop filter could be implemented as a second-order filter, although it is of course contemplated that the loop filter may be of a higher order, or even a first order filter if desired. In the present example, multiple loop paths, indicated at P2 and P3 operate upon the FB signal such that the loop filter suppresses distortion from the half-bridges which provide the FB signal (and drive an output channel).

The first variable time constant integrator 308 can receive a filtered difference signal corresponding to the difference between an input signal corresponding to a desired audio output and feedback from the current audio output. The first variable time constant integrator 308 integrates this difference and provides the result to a sequence of respective second and third adders 312 and 314. The second adder 312 adds in another feedback term from the loop filter block 304 to the integrated difference from the first variable time constant integrator 308. The third adder 314 receives the second output of the second adder 312 and adds in another feedback term from loop filter block 304 indicated as loop path P3. The feedback term from the loop filter block 304 that can be provided to the third adder 314 can include, for example, a high pass filter 316. The third adder 314 can also add a reference waveform from a square wave generator 318. The sum from the output of third adder 314 can be integrated by the second variable time constant integrator 310.

In the present example, a PWM reference waveform can be generated by the square wave generator 318 in response to a periodic signal (OSC) provided to the square wave generator 318 from a power and control circuit. The OSC signal can, for example, be provided with an amplitude corresponding to a voltage communicated from a power supply feed-forward circuit. The square wave generator 318 can also be powered by the power supply feed-forward circuit via a forward feed (FWD FEED) signal. As an example, a PWM signal can be produced from the difference between a square wave and the signal provided by the second adder 312. Since the output of the third adder 314 can be applied to the second variable time constant integrator 310, the reference waveform in such an example can be applied as a square wave.

The output of the second variable time constant integrator 310 can be applied as an input to each of fourth and fifth adders 320 and 322. The fourth adder 320 can add the output of the second variable time constant integrator 310 with the output of a ramp signal generator 323. The output of the fourth adder 320 can correspond to a signal to be applied to a P-side half-bridge used to drive the output load. The fifth adder 322 subtracts the output of the second variable time constant integrator 310 from the output of the ramp signal generator 323. The output of the fifth adder 322 corresponds to the signal to be applied to an N-side half-bridge to drive the output load. The output of the fourth adder 320 can be applied to a first level detector 324. The first level detector 324 can generate a PWM signal of one polarity. The output of the fifth adder 322 can be applied to a second level detector 326. The second level detector 326 can generate a complementary PWM signal relative to that of the first level detector 324. The pair of PWM signals, which correspond to the output signals that can be applied to the P-side and N-side half-bridges, can be applied to a modulator control logic 328 that can ensure that the pair of PWM output signals will have minimum pulse widths.

The output of the modulator control logic 328 and the OSC signal can be applied to a clip detector 330. The clip detector 330 can provide a digital signal (RESET) that indicates an operation state of the modulator 300. That is, if the modulator 300 is in an activated state, the clip detector 330 can provide a LOW state (e.g., logical '0') signal. If the modulator 300 is in a deactivated state, the clip detector 330 can provide a HIGH state (e.g., logical '1') signal. The output of the clip detector 330 can be provided to the first variable time constant integrator 308 as the RESET signal.

As an example, when the clip detector 330 provides a RESET signal with a digital logic HIGH value, an integration time constant ($\tau$) of the first variable time constant integrator 308 can be reduced to at or near zero, which can disable the first variable time constant integrator 308. Additionally, when the clip detector 330 provides a digital logic LOW value, the first variable time constant integrator 308 can be reactivated. When the integration time constant ($\tau$) of the first variable time constant integrator 308 is reduced to at or near zero, the gain of the first variable time constant integrator 308 is also reduced to about zero.

The ramp signal generator 323 can receive an ENABLE (e.g., a control signal) signal from a controller. The ENABLE signal can cause the ramp signal generator 323 to provide a ramp signal. The ramp signal can be provided, for example, to activate or deactivate (e.g., start up or shut down) the audio channel. Additionally or alternatively, the ramp signal can be provided, for example, to mute or unmute the audio channel.

The modulator 300 is illustrated as a second order, two pole filter system with an associated closed loop transfer function. In the present example, the first variable time constant integrator 308 corresponds to a first stage of the second order, two pole filter system, and the second variable time constant integrator 310 corresponds to a second stage of the second order system, two pole filter systems. Each of the first and second stages could be implemented, for example, as filters or amplifiers having associated transfer functions. The first variable time constant integrator 308 thus can be configured to define a first pole of the second order, two pole filter system. The second variable time constant integrator 310 can be configured to define a second pole of the second order, two pole filter system. In the activated state of operation, the first pole can be a dominant pole (relative to the second pole), while in the deactivated state of operation; the second pole can be the dominant pole (relative to the first pole). The ramp signal can be provided to the first variable time constant integrator 308 and the second variable time constant integrator 310 to change dominance of the poles, thereby also varying the transfer function associated with the second order, two pole filter system.

For example, the ramp signal can be provided to the first and second variable time constant integrators 308 and 310. As is known, a time constant (τ) of each integrator can be defined by a resistance and a capacitance component thereof. The time constant (τ) of the first and second variable time constant integrators 308 and 310 can be varied, for example, by the varying a resistance and/or capacitance value of the integrator. Providing an increasing ramp signal (e.g., a ramp signal having a positive slope) such as during an deactivating event (e.g., shut down or muting event) to the first and second variable time constant integrators 308 and 310 causes the integration time constants (τ) of the first and second variable time constant integrators 308 and 310 to decrease (e.g., by causing a correspondence decrease in the associated values). It will be appreciated by one skilled in the art that the time constant (τ) associated with the first variable time constant integrator 308 can vary at a same rate and/or same amount as the time constant (τ) associated with the second variable time constant integrator 310. However, one skilled in the art will appreciate that the time constants (τ) of the first and second variable time constant integrators 308 and 310 can vary by different amounts and/or different rates to achieve a desired relationship between the time constants (τ) of the first and second variable time constant integrators 308 and 310. Moreover, providing the decreasing ramp signal (e.g. ramp signal having a negative slope) to the first and second variable time constant integrators 308 and 310 as well as to the fourth and fifth adders 320 and 322 causes the output of the modulator 300 to be gradually reduced to at or near an electrically neutral vale (e.g., 0 volts), thus reducing or eliminating undesirable effects (e.g., a "click/pop" sound) of a faster deactivation of the modulator 300.

Conversely, providing a decreasing ramp signal such as during an activating event (e.g., start up or unmuting event) to the first and second variable time constant integrators 308 and 310 causes the integration time constants (τ) of the first and second variable time constant integrators 308 and 310 to increase (e.g., by causing a corresponding increase in the associated resistance value). Providing the increasing ramp signal to the first and second variable time constant integrators 308 and 310 as well as the fourth and fifth adders 320 and 322 causes the output of the modulator 300 to be gradually increased to return to an activated state, thus reducing or eliminating undesirable effects (e.g., a "click/pop" sound) of a faster activation of the modulator 300. The integration time constant (τ) of the first and second variable time constant integrators 308 and 310 can be varied while maintaining the closed loop paths of the modulator 300, thereby ensuring stability of the modulator 300. The modulator 300 can thus provide means for transitioning a means for providing PWM signals between at least two operation states (e.g., the activated state and the deactivated state) based on the RAMP signal.

Figure 4:
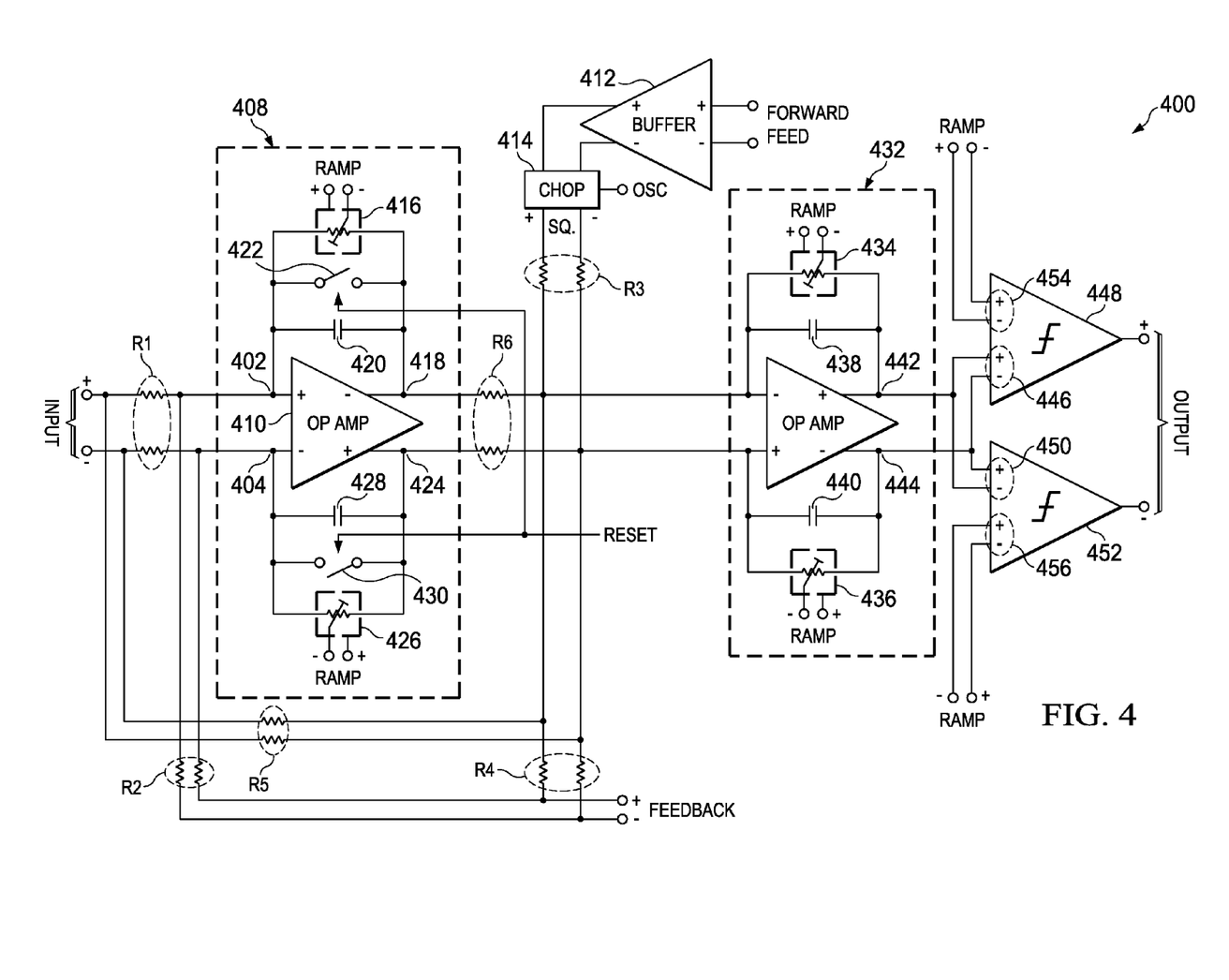
FIG. 4 illustrates another example of a modulator in accordance with an aspect of the invention.

FIG. 4 illustrates a circuit component diagram of a modulator 400, such as corresponding to the modulator 300 depicted in FIG. 3, in accordance with an aspect of the invention. The modulator 400 is depicted in a differential implementation, although those skilled in the art will be readily able to implement the modulator 400 according to other implementations, including a single-ended signal implementation. However, for purposes of simplification of explanation, the differential implementation is illustrated and described.

A differential analog INPUT signal (e.g., an audio signal) can be applied to positive and negative terminals 402 and 404 of a first variable time constant integrator 408. A pair of resistors, indicated at R1, can be connected between the INPUT signal and the positive and negative terminals 402 and 404 to regulate the current and/or voltage provided to the first variable time constant integrator 408. The first variable time constant integrator 408 can include, for example, a first differential operational amplifier (FDOA) 410. The FDOA 410 can be constructed according to conventional techniques. As is known in the art, the FDOA 410 produces a differential output in response to a differential voltage received at the FDOA 410 input. In the present example, positive and negative components of a differential feedback (FEEDBACK) signal can be received from half bridges that drive an output load (e.g., a loudspeaker). The positive and negative components of the differential FEEDBACK signal can be applied to the positive and negative terminals 402 and 404 of the first variable time constant integrator 408, respectively. Another pair of resistors, indicated at R2 can be connected between the FEEDBACK signal and the positive and negative terminals 402 and 404 of a first variable time constant integrator 408. R2 can be included to regulate current and/or voltage provided by the FEEDBACK signal.

Additionally, in the present example, a differential power signal (e.g., a FWD FEED) signal can be provided to a differential buffer 412. The output of the differential buffer 412 can be provided to a chopping circuit 414 that is controlled by an oscillation signal, OSC. The chopping circuit 414 can provide a differential square wave (indicated at SQ.) at a frequency substantially equal to the frequency of the OSC signal and the differential square wave can have amplitude substantially equal to the output voltage of the differential buffer 412. The positive component of the differential square wave can be provided to the negative component of the differential FEEDBACK signal and to the negative component of the differential INPUT signal. The negative component of the differential square wave can be provided to the positive component of the FEEDBACK signal and to the positive component of the INPUT signal. A pair of resistors, indicated at R3 can be connected at the output terminals of the chopping circuit 414 to regulate the current and/or voltage provided by the differential square wave. Another pair of resistors, indicated at R4 can be connected between the pair of resistors R3 and the FEEDBACK signal to further regulate the current and/or the voltage of the differential square wave. Still another pair of resistors, indicated at R5, can be connected between the pair of resistors R3 and the INPUT signal to further regulate the current and/or the voltage of the differential square wave.

The first variable time constant integrator 408 can include, a voltage controllable variable resistor 416 connected at a first feedback path that can be defined as an electrical path between a negative output terminal 418 of the FDOA 410 and the positive input terminal 402 of the FDOA 410. The resistance could be controlled, for example, by a differential RAMP signal such as described herein. A capacitor 420 can be connected in parallel with the voltage controlled variable resistor 416. Furthermore, a normally opened shorting circuit 422 can also be connected in parallel with the voltage controlled variable resistor 416 and the capacitor 420. The normally opened shorting circuit 422 can be controlled, for example, by a RESET signal. The normally opened shorting circuit 422 could be implemented, for example as one or more transistors, such as a transfer gate. The first variable time constant integrator 408 can also include a voltage controlled variable resistor 426 (controlled by the differential RAMP signal), a capacitor 428 and a normally opened shorting circuit 430 (controlled by the RESET signal) connected in parallel in a second feedback path. The second feedback path can be defined as an electrical path between a positive output terminal 424 of the FDOA 410 and the negative input terminal 404 of the FDOA 410. The capacitors 420 and 428 can, for example, be provided with the same or similar capacitance values.

An integration time constant ($\tau$) of the first variable time constant integrator 408 can be expressed as follows:

$$\tau = R \times C \qquad \text{Equation 1}$$

where:
R=total resistance, in ohms ($\Omega$) of a feedback path;
C=total capacitance, in Farads (F) of a feedback path.

Thus, as shown in Equation 1, reducing the total resistance (R) at both the first and second feedback paths reduces the integration time constant ($\tau$), thus reducing the integration time performed by the first variable time constant integrator 408. In the first variable time constant integrator 408, the resistance (R), and therefore the time constant ($\tau$) can be varied in two separate ways. First, if the normally opened shorting circuits 422 and 430 are in a closed state, the resistance (R) can be reduced to approximately zero. Such a reduction causes the time constant ($\tau$) of the first variable time constant integrator 408 to also reduce to approximately zero. When the time constant ($\tau$) of the first variable time constant integrator 408 is reduce to approximately zero, the gain of the first variable time constant integrator 408 is reduced about zero, such that the output of the first variable time constant integrator 408 is at a common mode voltage (e.g., electrically neutral). The normally opened shorting circuits 422 and 430 can be in a closed state, for example, when the RESET signal is at a HIGH state (e.g., logical '1').

The HIGH state (e.g., logical '1') RESET signal causes the first variable time constant integrator 408 to discharge upon power-up or some other event in which the modulator 400 outputs are expected to be quite different from, and have no relation to, the input signal, such as transitioning from a deactivated state to an activated state. With such an implementation, a previous condition of modulator 400 is removed, reducing latency in the modulator 400 reaching an appropriate desired output state.

Additionally, when the shorting circuits are opened, such as when the RESET signal is provided at a LOW state (e.g., logical '0'), the time constant ($\tau$) of the first variable time constant integrator 408 can be varied by the voltage controlled variable resistors 416 and 426. As an example, when the differential RAMP signal (that controls the resistance of the voltage controlled variable resistors 416 and 426) is electrically neutral (e.g., a voltage level of '0'), the variable resistance is at a maximum value to provide a maximum leakage resistance, the maximum leakage resistance being selected based on the capacitance of the capacitors 420 and 428. When the differential RAMP signal is activated (such as when a shut down or muting event occurs), the leakage resistance decreases as a difference between the components of the differential RAMP signal increases, and can continue to decrease until the differential RAMP signal reaches a maximum difference between the components of the differential RAMP signal, thereby causing the modulator 400 to transition from an activated state of operation to a deactivated state of operation. When the differential RAMP signal is deactivated (such as when a start up or unmuting event occurs), the leakage resistance increases as the difference between the components of the differential RAMP signal decreases until both components of the differential RAMP signal are returned to the electrical neutral state, at which point the leakage resistance will once again be at the maximum value, thereby causing the modulator 400 to transition from the deactivated state of operation to the activated state of operation.

The differential output of the first variable time constant integrator 408 can be applied to the input of a second variable time constant integrator 432. Each of a pair of resistors indicated at R6 can be connected between the output of the first variable time constant integrator 408 and a respective input of a second variable time constant integrator 432 to regulate current and/or voltage output by the first variable time constant integrator 408. Additionally, the positive output component of the differential square wave can be applied to a negative output terminal 418 of the first variable time constant integrator 408. Conversely, the negative component of the differential square wave can be applied to a positive output terminal 424 of the first variable time constant integrator 408.

The second variable time constant integrator 432 can be implemented in a manner similar to the first variable time constant integrator 408 without the inclusion of the normally opened shorting circuits 422 and 430. However, in some implementations, the normally opened shorting circuits 422 and 430 could be included. In the example of FIG. 4, the second variable time constant integrator can be implemented with voltage controlled variable resistors 434 and 436 each connected in parallel with capacitors 438 and 440 to form feedback paths for the second variable time constant integrator 432. Thus, a time constant ($\tau$) of the second variable time constant integrator 432 can also be controlled by the differential RAMP signal in a manner similar to the first variable time constant integrator 408.

Positive and negative output terminals 442 and 444 of the second variable time constant integrator 432 can be respectively connected to a first set of positive and negative terminals (indicated at 446) of a first level detector 448. The negative and positive output terminals 442 and 444 of the second variable time constant integrator 432 can also be respectively connected to a first set of positive and negative terminals (indicated at 450) of a second level detector 452. Negative and positive components of the differential RAMP signal can be respectively applied to a second set of positive and negative terminals on both the first and the second level detectors 448 and 445, the second sets being indicated at 454 and 456. The first and second level detectors 448 and 452 can provide a differential PWM output signal (indicated as OUTPUT). The differential PWM output signal can be provided, for example, to a modulator control logic and/or half bridges that can drive the associated output load.

In an activated state of operation (e.g., steady state), the differential analog input signal (INPUT) can be received from the preamplifier at the first variable time constant integrator 408, along with the differential FEEDBACK signal from the half bridges, as well as the differential square wave. The difference voltage at the input of the first variable time constant integrator 408 can be integrated and applied to the second variable time constant integrator 432, while being summed with the differential square wave. Those skilled in the art will recognize that, for purposes of PWM, the addition of a differential periodic waveform (e.g., the differential square wave) to a differential signal that is time-varying at a much lower frequency than the periodic waveform (e.g., output of the first variable time constant integrator 408), with both signals at the same DC level (e.g., neutral) results in a summed signal that is equivalent to a difference signal that would result if the signals were subtracted from one another. The second variable time constant integrator 432 can generate a differential output signal that corresponds to the integration of the output of the first variable time constant integrator 408 summed with the differential square wave.

With the differential RAMP signal at about neutral (e.g., zero volts or other common mode voltage level), the output of the second variable time constant integrator 432 can be applied to the first and second level detectors 448 and 452. The output of the second variable time constant integrator 432 can be a periodically varying signal of opposite polarities. The output of the first level detector 448 will be driven to a positive voltage rail (e.g., a positive voltage) when the difference voltage between the positive and negative output terminals 442 and 444 of the second variable time constant integrator 432 is above a threshold value. Conversely, the output of the first level detector 448 can be at a neutral voltage rail (e.g., a neutral voltage) when the difference between the positive and negative components of the first level detector 448 is below the threshold value.

The output of the second level detector 452 can be configured to provide a complement output voltage of the first level detector 448. Accordingly, the output of the second level detector 452 will be driven to the neutral voltage rail (e.g., electrically neutral) when the difference voltage between the positive and negative components of the second variable time constant integrator 432 is above a threshold value. Conversely, the output of the second level detector 452 can be driven to the positive voltage rail when the difference between the positive and negative components of the second level detector 452 is below the threshold value. The first and second level detectors 448 and 452 thusly generate an OUTPUT signal that can be implemented as a PWM signal with a fundamental frequency set by the reference waveform frequency of the OSC signal.

When the differential RAMP signal is provided to the voltage controlled resistors 416, 426, 434 and 436, such as in a deactivation (or muting) event, the time constant (τ) for both the first variable time constant integrator 408 and the second variable time constant integrator 432 can decrease depending on the difference between the components of the differential signal RAMP signal. The time constants (τ) for the first variable time constant integrator 408 and the second variable time constant integrator 432 can vary at the same rate and/or same amount. Additionally or alternatively, the time constants for the first variable time constant integrator 408 and the second variable time constant integrator 432 can vary at different rates and/or different amounts to achieve a desired relationship between the respective time constants. Additionally, the differential RAMP signal will be subtracted from the inputs of the first and second level detectors 448 and 452, thus reducing the duty cycle of the OUTPUT signal as the difference between the components of the differential RAMP signal increases. Once the difference between the components of the differential RAMP signal is at a maximum level, the duty cycle of the OUTPUT signal will be reduced to about zero, causing the OUTPUT signal to remain in a deactivated state (e.g., neutral state) until the RAMP signal is deactivated.

Moreover, the OUTPUT signal being at a neutral state will cause the RESET signal to be driven to a HIGH state (e.g., logical '1'). The HIGH state RESET signal can thusly cause the normally opened shorting circuits 422 and 430 at the first variable time constant integrator 408 to be closed, thereby discharging the associated capacitors, which causes the time constant (τ) of the first variable time constant integrator 408 to be reduced to at or near zero, thereby causing the gain of the first variable time constant integrator 408 to be reduced to about zero, thus causing the first variable time constant integrator 408 to provide the common mode signal (e.g., electrically neutral).

When the RAMP signal is deactivated, such as in an activation (e.g., start up) or unmuting event, the difference between the components of the differential RAMP signal will gradually decrease from the maximum level until both components of the differential RAMP signal are at the neutral level, causing the duty cycle of the OUTPUT signal to increase as the difference in the components of the differential RAMP signal decreases. At which point (e.g., both of the components of the differential RAMP signal being a neutral state) the modulator 400 will return to the activated (e.g., steady state) state of operation. Varying the integration time constant (τ) of the first and second variable time constant integrators 408 and 432 allows for a smooth transition between states (activated and deactivated states) of operation of the modulator 400, while maintaining the closed loop paths of the modulator 400, thereby ensuring stability of the modulator 400.

In the present example, the modulator 400 is illustrated as a second order, two pole filter system having an associated closed loop transfer function. The first variable time constant integrator 408 can define a first pole of the second order, two pole filter system. The second variable time constant integrator 432 can define a second pole of the second order, two pole filter system. Each of the first and second variable time constant integrators 408 and 432 can also define a transfer function. In the activated state of operation, the first pole can be a dominant pole (relative to the first pole) of the second order, two pole filter system. In the deactivated state of operation, the second pole can be the dominant pole (relative to the first pole) of the second order, two pole filter system. During a transition between the activated state and the deactivated state, the RAMP signal can cause the pole dominance to smoothly shift from the first pole (defined by the first variable time constant integrator 408) to the second pole (defined by the second variable time 432). Additionally, during a transition between the deactivated state and the activated state, the ramp signal causes the pole dominance to smoothly shift from the second pole to the first pole. It is to be understood that the shifting of the pole dominance also varies the transfer function associated with the second order, two pole system accordingly. As discussed above, a smooth transition between the activated state and the deactivated state (and vice versa) reduces transient signals and/or audible artifacts associated with a sharp transition between operating states.

Figure 5:
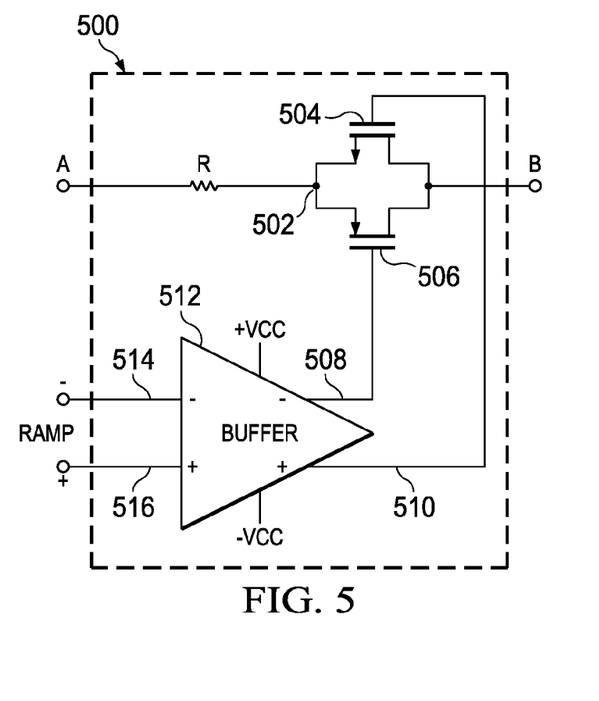
FIG. 5 illustrates an example of a voltage controlled variable resistor in accordance with an aspect of the invention.

FIG. 5 illustrates an example of a voltage controllable variable resistor 500 that could be implemented in a modulator in accordance with an aspect of the invention. The voltage controllable variable resistor 500 includes a first resistor indicated as R that is connected to a first node indicated at 'A'. The ohmic value of the resistor R can be chosen as the minimum (or near minimum) resistance for the voltage controllable variable resistor 500. The resistor R can be connected at a second node 502 with two transistors 504 and 506. In the present example, the two transistors 504 and 506 are illustrated as metal oxide semiconductor field effect transistors (MOSFETs), but one skilled in the art will appreciate that other transistors and or transistor combinations could be implemented as well, such as bipolar junction transistors (BJTs), junction field effect transistors (JFETs), or the like. In the present implementation, the second node 502 of the resistor is connected to a source node of a P-channel MOSFET 506 and an N-channel MOSFET 504. Additionally, a drain node of the P-channel MOSFET 506 and a drain node of the N-channel MOSFET 504 can be connected at a third node indicated at 'B'. The gates of the P-channel MOSFET 506 and the N-channel MOSFET 504 can be controlled, for example, by respective negative and positive output terminals 508 and 510 of a differential buffer 512. A negative component of a differential RAMP signal can be provided to a negative input terminal 514 of the differential buffer 512, while a positive component of the differential RAMP signal can be provided to a positive input terminal 516 of the differential buffer 512.

When the differential RAMP signal is provided in a neutral condition, such as in a activated state (e.g., steady state) of operation, the negative output terminal 508 of the differential buffer 512 can be at a positive voltage rail (e.g., +VCC), while the positive output terminal 510 of the differential buffer 512 can be at a negative voltage rail (e.g. −VCC) thereby driving the N-channel MOSFET 504 and the P-channel MOSFET 506 to a cutoff mode, thusly blocking current passing through the N-channel and the P-channel MOSFETs' 504 and 506 drain. Accordingly, a relatively large voltage drop across the drain and source nodes of the P and N-channel MOSFETs 504 and 506 are possible. When the RAMP signal is activated, such as in a deactivating (e.g., shut down) or muting event, the negative output terminal 508 of the differential buffer 512 output gradually decreases to the negative voltage rail, while concurrently the positive output terminal 510 of the differential buffer 512 output gradually increases to the positive voltage rail. The decreasing voltage at the gate of the P-channel MOSFET 506 causes the P-channel MOSFET 506 to transition from the cutoff mode to a saturation mode and subsequently to a linear mode, thereby decreasing the voltage drop across the P-channel MOSFET 506. Moreover, the increasing voltage at the gate of the N-channel MOSFET 504 causes the N-channel MOSFET 504 to transition from the cutoff mode to a saturation mode and subsequently to a linear mode, thereby decreasing the voltage drop across the N-channel MOSFET 504.

When the differential RAMP signal is deactivated, such as in an activating (e.g., start up) or unmuting state, the negative output terminal 508 of the differential buffer 512 gradually increases to the positive voltage rail, while concurrently the positive output terminal 510 of the differential buffer 512 output gradually decreases to the negative voltage rail. The decreasing voltage at the gate of the N-channel MOSFET 504 causes the N-channel MOSFET 504 to transition from the linear mode to the saturation mode and subsequently to the cutoff mode, thereby increasing the possible voltage drop across the N-channel MOSFET 504. Moreover, the increasing voltage at the gate of the P-channel MOSFET 506 causes the P-channel MOSFET 506 to transition from the linear mode to the saturation mode and subsequently to the cutoff mode, thereby increasing the possible voltage drop across the P-channel MOSFET 506.

The resistance between node 'A' and node 'B' varies depending on a difference between components of the differential RAMP signal. That is, when the RAMP signal is in a neutral state, the resistance between the nodes 'A' and 'B' will be at a maximum, and when the RAMP signal is activated, the resistance between the nodes 'A' and 'B' will transition to the minimum resistance at approximately the same rate that the difference between the components of the differential RAMP signal increases. Conversely, when the RAMP signal is deactivated, the resistance between the nodes 'A' and 'B' will transition from the minimum resistance to the maximum resistance at approximately the same rate that the difference between the components of the differential RAMP signal decreases.

Figure 6:
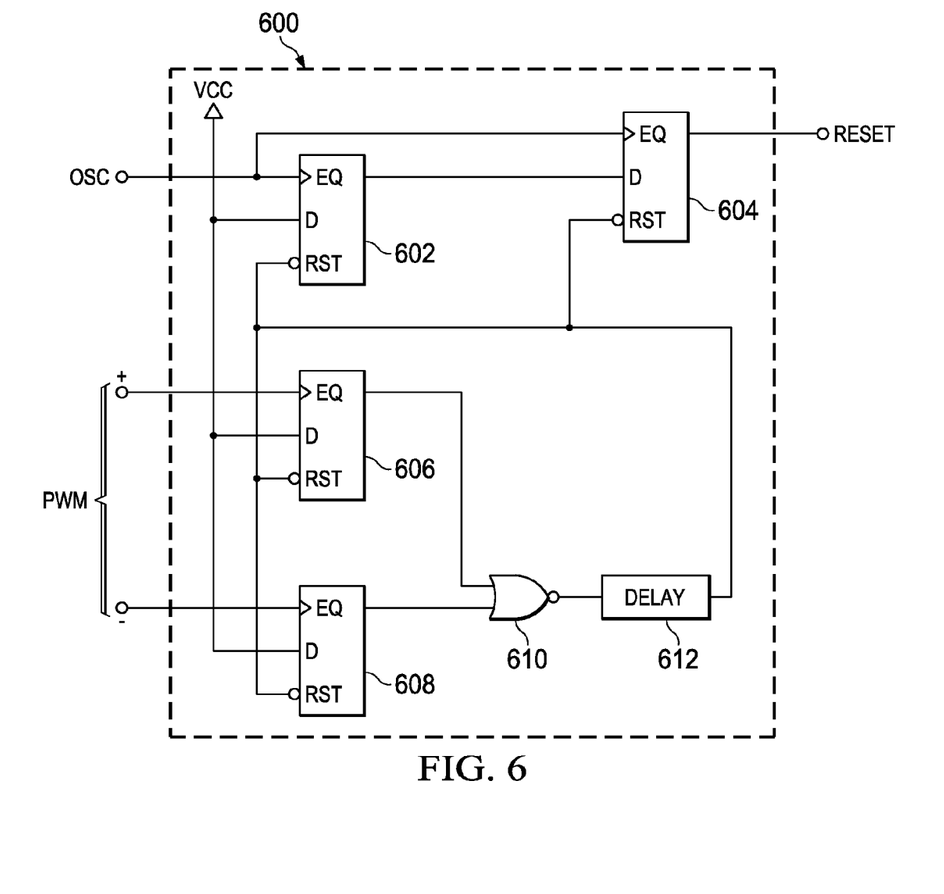
FIG. 6 illustrates an example of a clip detector in accordance with an aspect of the invention.

FIG. 6 illustrates an example of a clip detector 600 that could be implemented in a modulator in accordance with an aspect of the invention. The clip detector 600 could be implemented, for example as the clip detector 330 illustrated in FIG. 3. The clip detector 600 can include, for example a first D-flip flop 602 that is clocked by an oscillation signal, OSC. A data input of the first D-flip flop 602 can be tied to a HIGH state (e.g., VCC). An output of the first D-flip flop 602 can be provided to a data input of a second D-flip flop 604. The second D-flip flop 604 can also be clocked by the OSC signal. The output of the second D-flip flop 604 can correspond to and output of the clip detector 600, which can be implemented as a RESET signal.

Third and fourth D-flip flops 606 and 608 can be clocked by respective positive and negative components of a PWM input signal. Similarly to the first D-flip flop 602, the data input of the third and fourth D-flip flops 606 and 608 can be tied to a HIGH state. The outputs of the third and fourth D-flip flops 606 and 608 can be provided as inputs to a NOR gate 610. The output of the NOR gate 610 can be delayed at delay 612 and provided to a reset input of the first, the second, the third and the fourth D-flip flops 602, 604, 606 and 608.

When the PWM input signal is provided in an activated state (e.g., steady state or switching state), the output of the NOR gate 610 will go LOW at each LOW-to-HIGH transition of either PWM signal, causing a reset of all four D-flip flops 602, 604, 606, and 608 at the same rate as the PWM signal. This causes the output (e.g., the RESET signal) of the clip detector 600 (the output of the second D-flip flop 604) to remain in a LOW state (e.g., logical '0'). When the PWM input signal is provided in a deactivated state (e.g., non-switching state), the output of the NOR gate 610 will be at a HIGH state, which HIGH state releases the first through fourth D-flip flops 602, 604, 606 and 608 from the reset state. Such a state causes the HIGH data input at the first flip flop to be passed to the data input of the second flip flop and output as the RESET signal, thus driving the RESET signal to a HIGH state (e.g., logical '1'). The clip detector 600 can thus provide means for detecting an operation state of a modulator, as well as means for providing the RESET signal to a means for transitioning operation states of an audio channel in response to detecting a deactivated state.

Figure 7:
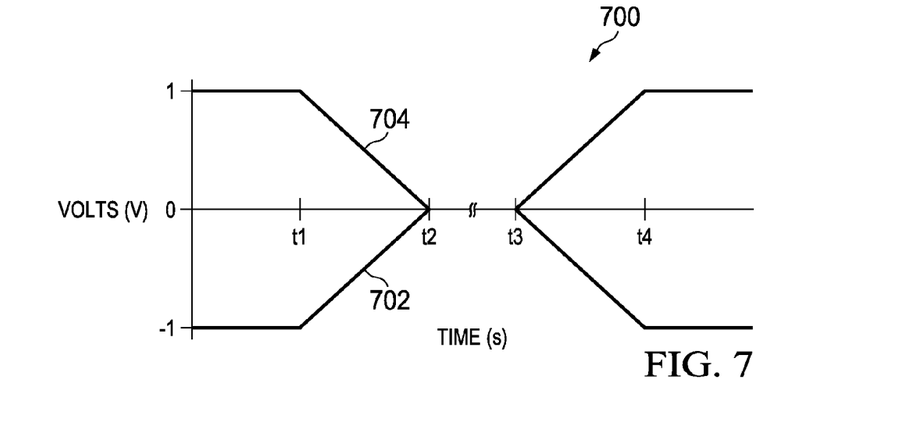
FIG. 7 illustrates an example of ramp signals in accordance with an aspect of the invention.

FIG. 7 illustrates an example of a RAMP signal 700 in accordance with an aspect of the invention. In FIG. 7, the RAMP signal is depicted that can be generated such as a common mode ramp signal. The RAMP signal 700 can be implemented as a differential signal with a negative component 702 and a positive component 704. For purposes of simplification of explanation, the differential RAMP signal 700 is illustrated as having a maximum positive voltage of 1 and a minimum negative voltage of −1, but one skilled in the art will appreciate that other minimum and maximum voltage rails could be implemented. Furthermore, in the present example, the voltage of the differential RAMP signal 700 is plotted as a function of time. The positive component 704 of the differential RAMP signal 700 for any point of time illustrated will be provided at 0 or more volts, while the negative component 702 of the differential RAMP signal 700 will be provided at 0 or less volts (e.g., more negative). The positive and negative components 704 and 702 of the differential RAMP signal 700 can have opposite polarities relative to zero volts or another common mode voltage.

In the present example, from time 0 until time t1, both the positive and negative components 704 and 702 of the differential RAMP signal 700 are provided at about respective maximum (e.g., 1 volt) and minimum (e.g., −1 volt) voltage levels. As an example, at a point in time indicated at t1, a RAMP deactivation (e.g. start up) or unmuting event can have occurred. Thus, at t1, the positive component 704 and the negative component 702 of the differential RAMP signal 700 begin to decrease and increase respectively, linearly and continue to do so until a time t2. At the time t2 until time t3, the positive and negative components 704 and 702 of the differential RAMP signal 700 can remain at an electrically neutral (e.g., zero) voltage level. Time t3 can, for example, correspond to the occurrence of a RAMP activation (e.g., shut down) or muting event. It is to be understood that the time between t2 and t3 can represent any amount of time. At time t3, the positive and negative components 704 and 702 of the differential RAMP signal 700 begin to increase and decrease respectively, and continue to do so until a time t4. At t4, both the positive and negative components 704 and 702 of the differential RAMP signal 700 are once again provided at about their respective maximum (e.g., 1 volt) and minimum (e.g., −1 volt) voltage levels.

The differential ramp signal could be provided, for example, to a second order, two pole filter system with an associated closed loop transfer function, such as the modulator 300 illustrated in FIG. 3 or the modulator 400 illustrated in FIG. 4. In such an implementation, the second order two pole filter system can include a first variable time constant integrator and a second variable time constant integrator that define a respective first and second pole of the second order, two pole filter system. During an activated state of operation of the second order, two pole filter system, such as the time between t2 and t3 the first and second poles of the of the second, order, two pole filter system can have a substantially equal frequency. Conversely, during a deactivated state of operation, such as the time between t0 and t1, as well as a time after t4, the second pole can be the dominant pole (relative to the first pole) of the second order, two pole filter system.

During a transition between the RAMP activated state and the RAMP deactivated state (e.g., between times t1 and t2), the differential ramp signal can vary a time constant associated with the first variable time constant integrator and the second variable time constant integrator to smoothly transition the dominance relative to the second pole. Moreover, during a transition between the RAMP deactivated state and the RAMP activated state (e.g., between times t3 and t4), the differential ramp signal can vary a time constant associated with the first variable time constant integrator and the second variable time constant integrator to smoothly reduce the dominance of the second pole relative to the first pole. Varying the time constants of the first and second variable time constant integrators varies a gain and a phase margin associated with the second order two pole filter system such as described herein. Such a smooth transition of gain and phase margin can assist in the reduction and or elimination of transient signals and audible artifacts (e.g., a "click/pop" sound) associated with a sharp transition between operating states.

Figure 8:
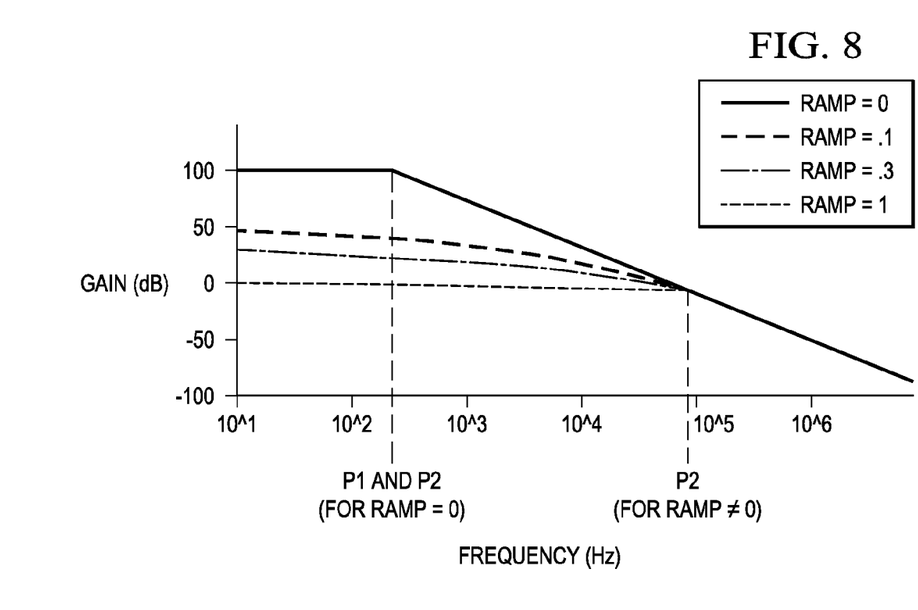
FIG. 8 illustrates a gain diagram of a modulator in accordance with an aspect of the invention.
Figure 9:
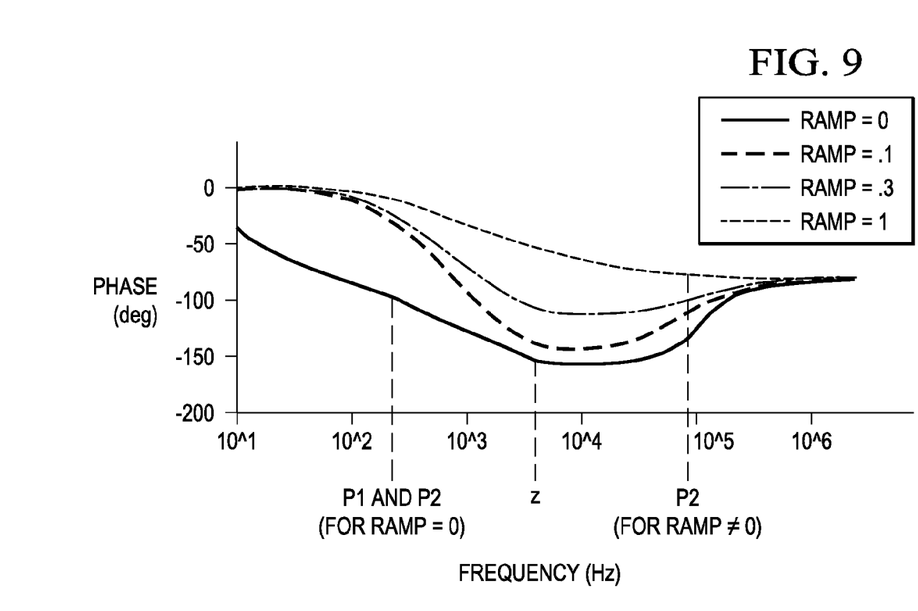
FIG. 9 illustrates a phase diagram of a modulator in accordance with an aspect of the invention.

FIGS. 8 and 9 illustrate a frequency response of a modulator (e.g., such as modulator 300 illustrated in FIG. 3 and/or modulator 400 illustrated in FIG. 4). In FIG. 8, a gain magnitude (in decibels) of the modulator output signal (in relationship to a magnitude of the modulator input) is plotted as a function of frequency in hertz. FIG. 9 illustrates a phase of the of the modulator output signal in relationship to a phase of the modulator input signal plotted as a function of frequency in hertz for four different example RAMP signals.

In FIGS. 8 and 9, multiple frequency responses are illustrated for different discrete values (e.g., voltages) of a RAMP signal. For purposes of simplification of explanation, only four different values of the RAMP signal (0, 0.1, 0.3 and 1) are illustrated in FIGS. 8 and 9. Additionally, it is to be understood that the RAMP signal could be implemented as a differential RAMP signal, such that each given value of the ramp signal (0, 0.1, 0.3, and 1) can correspond a magnitude of positive and negative components of the differential RAMP signal at substantially opposite polarities. In FIG. 8, when the RAMP signal is at 0 (e.g., deactivated), the gain of the output signal can be about 100 decibels greater than the magnitude of the input signal up to a frequency of about 200-300 hertz. At a first pole, indicated at p1, the gain of the output signal beings to decrease as a function of the frequency. Moreover, also at p1, as shown in FIG. 8, the phase shift of the modulator output signal (in relation to the modulator input signal) increases from about −35 degrees to about −90 degrees at about 10 hertz to about the frequency of the first pole (e.g., 200-300 hertz). A second pole, indicated at p2, has relatively little effect on the gain of output signal, thus making p1 the dominant pole when the ramp signal is at 0 (e.g., deactivated). The phase shift increases from about −90 degrees to about −135 degrees between the first pole (p1) and a zero, indicated at z.

As illustrated in FIG. 8, when the RAMP signal is activated and reaches a value (e.g., voltage) of about 0.1, the gain of the modulator is reduced to about 45 decibels from 10 hertz to 1 kilohertz. At 1 kilohertz, the gain of the modulator (when the RAMP signal is at about 0.1) begins to decrease as the frequency increases. As illustrated in FIG. 9, an increase in the RAMP signal increases the phase margin for the modulator. That is, when the RAMP signal has a value of about 0.1, the phase shift of the modulator is reduced, such that the phase shift of the modulator increases from about unity (e.g., 0 degrees) to about −130 degrees between about 10 hertz and about 10 kilohertz. The phase shift decreases from about −130 degrees to about −90 degrees between about 10 kilohertz and about 1 megahertz.

As illustrated in FIG. 8, when the RAMP signal reaches a value (e.g., voltage) of about 0.3, the gain of the modulator is further reduced to about 30 decibels from about 10 hertz to about 10 kilohertz. At 10 kilohertz, the gain of the modulator (when the RAMP signal is at about 0.3) begins to decrease as the frequency increases. Moreover, as illustrated in FIG. 9, when the RAMP signal reaches a value (e.g., voltage) of about 0.3, the phase margin of the modulator increases further. Accordingly, when the RAMP signal has a value of about 0.3, the phase shift of the modulator is further reduced, such that the phase shift of the modulator increases from about unity (e.g., 0 degrees) to about −100 degrees between about 10 hertz and about 10 kilohertz. The phase shift decreases from about −100 degrees to about −90 degrees between about 10 kilohertz and about 1 megahertz.

When the RAMP signal reaches a value (e.g., voltage) of about 1 (e.g., the maximum value), the gain of the modulator is reduced to about unity (e.g. 0 decibels) from about 10 hertz to about p2. At p2, the gain of the modulator (when the RAMP signal is at about 1) begins to decrease as the frequency increases. Moreover, as illustrated in FIG. 9, when the RAMP signal reaches a maximum value (e.g., voltage) of about 1, the phase margin of the modulator increases still further. Thus, when the RAMP signal has a maximum value of about 1, the phase shift of the modulator is further reduced, such that the phase shift of the modulator remains at about unity (e.g., about 0 degrees) between 10 hertz and 100 hertz. The phase shift of the modulator increases from about unity (e.g., about 0 degrees) to about −90 degrees between about 100 hertz and about 1 megahertz. Accordingly, the first pole, p1 and the zero z have relatively little effect on the gain or the phase margin of the output signal when the RAMP signal reaches the maximum voltage.

As is illustrated in FIG. 8, increasing the RAMP signal decreases the gain of the modulator without introducing any (or nearly any) overshoot. That is, since the gain of the modulator (e.g., the modulator 300 or the modulator 400 illustrated in FIGS. 3 and 4, respectively) can be varied while the modulator remains in a stable closed loop system, overshoot can be substantially reduced or eliminated. Moreover, as it is illustrated in FIG. 8, the dominance of the poles p1 and p2 is smoothly shifted from p1 to p2 as the RAMP signal increases. Such a smooth transition of pole dominance can assist in reducing and/or eliminating transient signals and/or audible artifacts associated with a sharp transition between operation states of an audio system.

Figure 10:
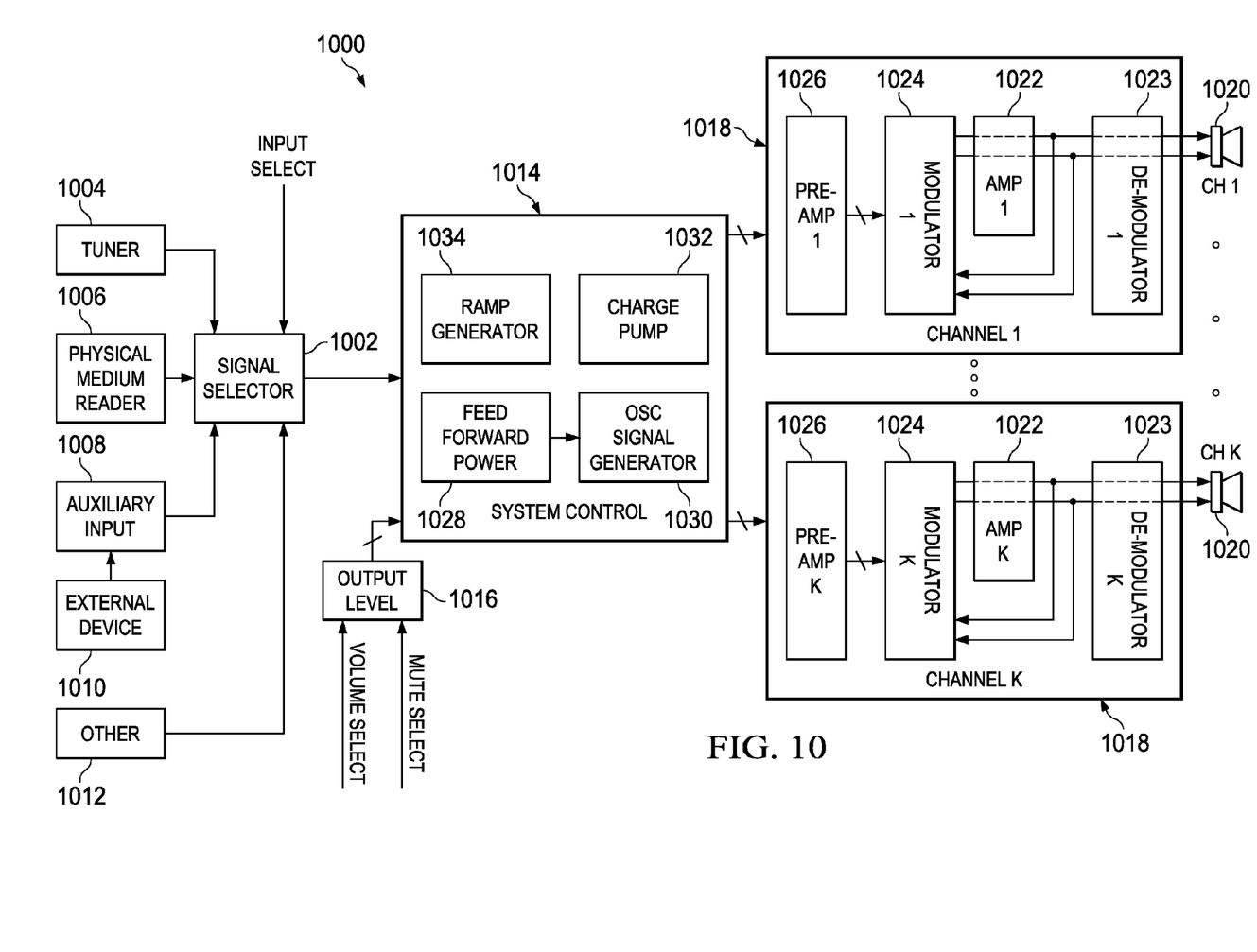
FIG. 10 illustrates an example of a multi-channel system in accordance with an aspect of the invention.

FIG. 10 illustrates an example of a multi-channel audio system 1000 in accordance with an aspect of the invention. The multi-channel audio system 1000 can include a signal selector 1002 that can be controlled by an INPUT SELECT signal. The INPUT SELECT signal could be provided, for example, as a result of a user selecting a particular input. The signal selector 1002 can receive an input signal from a number of different sources. As an example, the signal selector 1002 can receive a signal from an antenna tuner 1004. The antenna tuner 1004 can, for example, provide an amplitude modulated (AM) signal, or a frequency modulated (FM) signal to the signal selector 1002. A physical medium reader 1006, such as a cassette tape player or a compact disc (CD) player can also provide an input signal to the signal selector 1002. The signal selector 1002 can also receive an input signal from an auxiliary input port 1008. The auxiliary input port 1008 can be connected to an external device 1010, such as a moving pictures experts group (MPEG) audio layer 3 (MP3) player. It is also considered that the signal selector 1002 could receive an input signal from some other device and/or system 1012, such as could be implemented as a satellite receiver and/or a navigation system.

The signal selector 1002 can provide an audio signal to a system control 1014 based on the INPUT SELECT signal. An output level selector 1016 can provide a signal that indicates a desired output level (e.g., audio volume) to the system control 1014. The output level selector 1016 can also be configured to provide an activate and/or deactivate signal (e.g., start up and/or shut down signal) that causes the system control 1014 to transition to the activated or deactivated condition, respectively. Additionally or alternatively, the output level selector 1016 can provide a mute and/or unmute signal to the system control 1014 that causes the system control 1014 to enter a mute and/or unmuting condition.

The system control 1014 can be connected to K number of output channels 1018, where K is integer greater than or equal to one. Each output channel 1018 can be implemented, for example, as the output channel 200 illustrated in FIG. 2. Each output channel 1018 can be associated with one or more loudspeakers 1020, although for purposes of simplification of explanation, only one loudspeaker 1020 per output channel 1018 is illustrated. The loudspeakers 1020 can be driven, for example, by an associated amplifier 1022. For instance, each amplifier 1022 can amplify a PWM signal provided by an associated modulator 1024 and provide a feedback signal to the associated modulator 1024 to form a closed-loop system. Additionally, a demodulator 1023 can be connected between each of the amplifiers 1022 and the associated loudspeaker 1020 to demodulate the signals provide by the amplifier 1022. The demodulator 1023 could be implemented, for example, as an LC low pass filter with a cutoff frequency of about 40 kHz. Each of the K number of modulators 1024 could be implemented, for example, as the modulators 300 and 400 illustrated in FIGS. 3 and 4, although one skilled in the art will appreciate that other implementations are possible as well. The modulators 1024 can include, for example one or more variable time constant integrators that can define two or more poles of a second order, two pole filter system with an associated closed loop transfer function. The modulators 1024 can be provided with an input signal by an associated preamplifier 1026. Each preamplifier 1026 can, for example, control the output level (e.g., volume) of the associated one or more loudspeakers 1020.

The system control 1014 can provide an input signal to each of the K preamplifiers 1026. It is to be understood that the input signal provided to each of the K preamplifiers 1026 could be different signals, such as in a stereo or surround sound system. Alternatively, the input signal provided to each of the K preamplifiers 1026 could be substantially uniform signals, such as in a monophonic sound system. The system control 1014 can provide each of the K preamplifiers 1026 with a gain control signal that can set the output level (e.g., volume) of each of the one or more loudspeakers 1020 associated with the K output channels 1018. The gain control signal can be based, for example, on the signal(s) provided by the output level selector 1016. The system control 1014 can include, for example, a feed forward power system 1028. The feed forward power system 1028 can provide a feed forward power signal for driving circuitry associated with the K modulators 1024. The feed forward power system 1028 can also cause an oscillator signal generator to provide an oscillation signal to each of the K modulators 1024.

The system control 1014 can also include a charge pump 1032. The charge pump 1032 can provide a signal to each of the K amplifiers 1022 for driving the one or more loudspeakers 1020 associated with each of the K output channels 1018. The system control 1014 can still further include a ramp signal generator 1034 that can provide a ramp signal (or a ramp enable signal, such as a control signal) to each of the K modulators 1024. The ramp signal can be provided, for example, in response to the system control 1014 receiving a signal from the output level selector 1016 indicating that a change in operating state (e.g., activated state or deactivated state) of the system 1000 has been selected. The ramp signal generator 1034 can thusly provide means for providing the ramp signal.

In an activated state (e.g., steady state) of operation, the system control 1014 can receive an input signal from the input selector, and a volume selection signal from the output level selector 1016 that indicates a desired volume. The system control 1014 can cause each of the K output channels 1018 to provide an audio signal at the one or more loudspeakers 1020 associated with each output channel 1018. However, when a deactivated (or mute) condition is selected, for example, by a user of the multi-channel audio system 1000, the output level selector 1016 provides a deactivation signal to the system control 1014. The deactivation signal causes the system control 1014 to provide a rising ramp signal (e.g., the signal between t3 and t4 illustrated in FIG. 7) to each of the K modulators 1024. The rising ramp signal causes the output the one or more loudspeakers 1020 associated with a given modulator 1024 to be reduced as the ramp signal increases until the output of the one or more loudspeakers 1020 associated with the given modulator 1024 is disabled.

When the deactivated condition is deselected, for example, by the user of the multi-channel audio system 1000, the output level selector 1016 provides an activation signal to the system control 1014. The activation signal causes the system control 1014 to provide a decreasing ramp signal (e.g., the signal between t1 and t2 illustrated in FIG. 7) to each of the K modulators 1024. The decreasing ramp signal causes the output of one or more loudspeakers 1020 associated with a given modulator 1024 to be increased as the ramp signal decreases until the volume at the one or more loudspeaker 1020 associated with the given modulator 1024 is restored to the level prior to the deactivation (e.g., the permuted level). Accordingly, the system control provides means for controlling the ramp signal. The ramp signal can be employed, for example, by each of the K modulators 1024 to smooth the transition from the activated state and the deactivated state and vice versa. As one example, the ramp signal can be employed to vary at least one of an integration time constant, gain and phase margin of the modulators 1024, such that pole dominance is smoothly transitioned between the first and second poles of the second order, two pole filter system of the modulators 1024. Such a smooth transition between operation states can reduce or eliminate transient signals provided to the one or more loudspeakers 1020 associated with a given modulator 1024 that can damage electrical components and/ or cause the one or more loudspeakers 1020 associated with the given modulator 1024 to produce undesirable audible artifacts (e.g., a "click/pop" sound) in the multi-channel audio system 1000.

Figure 11:
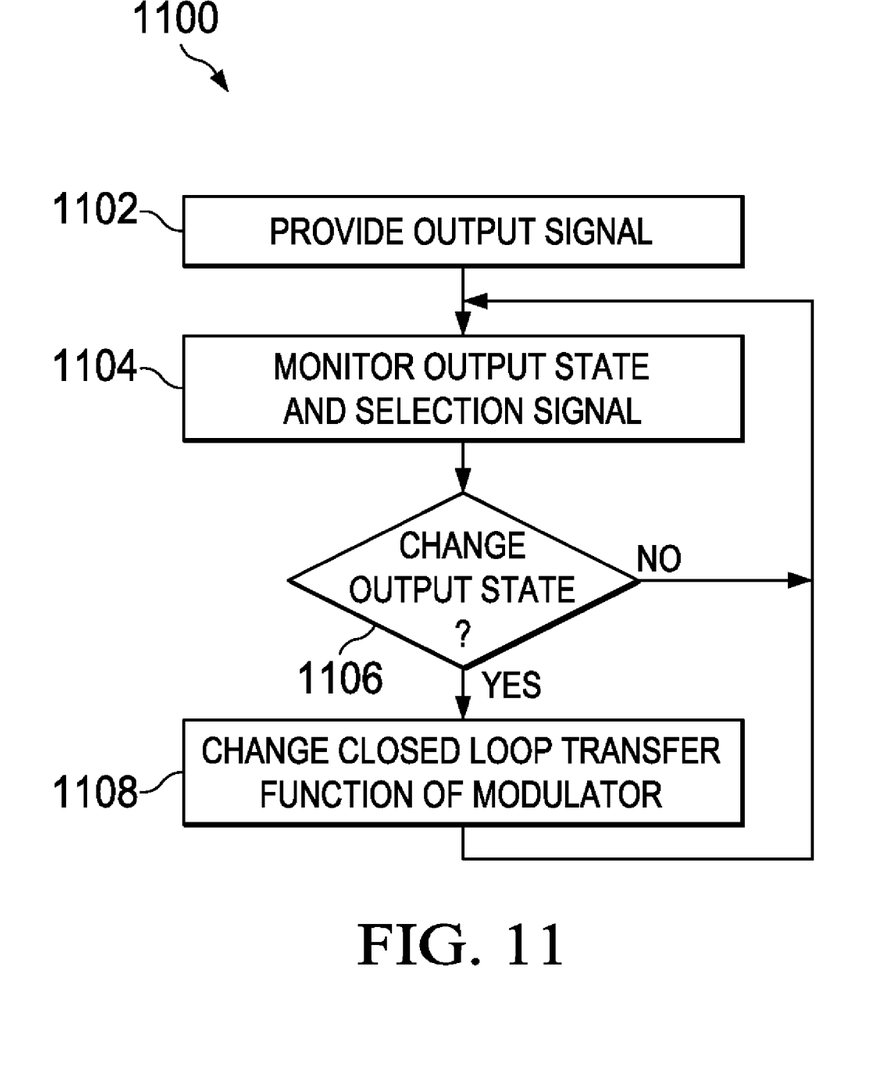
FIG. 11 illustrates a flow-chart diagram of a process in accordance with an aspect of the invention.

FIG. 11 illustrates a flow chart that depicts a process 1100 in accordance with an aspect of the invention. The process 1100 could be implemented, for example in a system that provides a PWM output signal, such as an audio system. At 1102, the PWM output signal can be provided. The PWM output signal could be provided, for example, by a modulator that includes at least one variable time constant integrator. As an example, include circuitry that the modulator can defines two poles of a second order, two pole filter system with an associated closed loop transfer function. In such a situation, a first pole of the second order, two pole filter system can be dominant (relative to a second pole of the second order, two pole filter system) when the audio system is in an activated state (e.g., steady state) of operation. Additionally, the second pole of the second order, two pole filter system can be the dominant pole (relative to the first pole of the second order, two pole filter system) when the system in the deactivated state of operation. To implement the second order, two pole filter system, the modulator can, for example, include at least one variable time constant integrator. The output signal provided by the modulator could be used, for example, to drive one or more loudspeakers of the audio system.

At 1104 an output state (e.g., activated or deactivated state) of the modulator can be monitored. At 1104, a selection signal can also be monitored. The selection signal can indicate if a change in the output state of the modulator is desired (e.g., an activation or deactivation event (e.g. start up/shut down) or a muting or unmuting event). At 1106 a determination is made as to whether a change in the output state of the modulator is occurring, such as based on the selection signal. If the determination at 1106 is negative (e.g., NO), the process 1100 returns to 1104. If the determination at 1106 is affirmative (e.g., YES), indicating a transition in output state, the process 1100 proceeds to 1108. At 1108, the closed loop transfer function associated with the modulator can be controlled to vary, causing the output of the modulator to change from the activated state to the deactivated state (or vice versa), which in turn can disable (or enable) audio output. The transfer function can be varied, for example, as a function of a RAMP signal, and/or a RESET signal. As an example, the transfer function can be varied by varying at least one of the integration time constant, gain and phase margin of the at least on integrator of the modulator commensurate with changes in the RAMP signal. Varying the transfer function can, for example, smoothly transition pole dominance of the second order, two pole filter system associated with the modulator thereby reducing or eliminating transient signals that could cause audio artifacts (e.g., a "click/pop" sound) at the output of the audio system during an output state change of the system.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such applications including alterations, modifications and variations that fall within the scope of the appended claims.

What is claimed is:

1. A closed loop amplifier system comprising:
   a modulator that provides a pulse-width modulated (PWM) output signal based on an input signal, the modulator having a variable closed loop transfer function;
   a ramp generator that provides a ramp signal to the modulator, the variable closed loop transfer function of the modulator varying as a function of the ramp signal; and
   a controller that controls the ramp generator to provide the ramp signal to adjust the variable closed loop transfer function during transitions between operating states of the closed loop amplifier system.

2. The system of claim 1, wherein the modulator further comprises a first stage and a second stage connected in series, each of the first stage and the second stage having a transfer function that varies based on the ramp signal, at least one of a gain and a phase margin of the first stage being dominant relative to the second stage based on the ramp signal supplied during a first portion of an activation state of the closed loop amplifier system.

3. The system of claim 2, wherein at least one of the gain and phase margin of the second stage is decreased based on the ramp signal that is supplied during a deactivation operating state of the closed loop amplifier system.

4. The system of claim 2, wherein the first stage and second stage each comprises an integrator having a time constant that varies as a function of the ramp signal.

5. The system of claim 1, the modulator further comprising at least one variable time constant integrator, wherein the ramp signal causes gain of the at least one variable time constant integrator to vary as a function of the ramp signal.

6. The system of claim 5, further comprising a clip detector configured to detect the operating state of the modulator, the clip detector providing a reset signal to the at least one variable time constant integrator in response to the clip detector detecting the modulator in a deactivated operating state, the reset signal causing the gain of the at least one variable time constant integrator to be reduced to about zero.

7. The system of claim 5, wherein the at least one variable time constant integrator further comprises a capacitance and a resistance that defines the integration time constant, wherein at least the resistance is controlled based on the ramp signal.

8. The system of claim 1, wherein the operating states comprises an activated state and a deactivated state.

9. The system of claim 1, wherein the modulator further comprises at least two modulators, wherein each of the at least two modulators comprises at least one variable time constant integrator, wherein the ramp signal causes a gain of each of the variable time constant integrators to vary as a function of the ramp signal.

10. The system of claim 9, wherein a time constant of each of the variable time constant integrators further comprises a capacitance and a resistance that defines the integration time constant, wherein at least the resistance is controllable by the ramp signal.

11. The system of claim 10, wherein the at least two operation states comprises an activated state and a deactivated state, the system further comprising a clip detector configured to detect a transition in the operating state of the modulator, the clip detector providing a reset signal to at least one of the variable time constant integrators in response to the clip detector detecting that the modulator has transitioned to the deactivated state.

12. The system of claim 11, wherein the reset signal causes a gain of the at least one of the variable time constant integrators to be reduced to about zero.

13. The system of claim 11, wherein the PWM output signal comprises a differential output signal and the ramp signal comprises a differential ramp signal.

14. A system for transitioning an operation state of a multi-channel system, the system comprising:
- means for providing a ramp signal;
- means for controlling the means for providing the ramp signal;
- means for providing a plurality of pulse-width modulated (PWM) signals that includes a means for filtering according to a transfer function that varies as a function of the ramp signal, wherein each of the plurality of PWM signals is associated with a respective channel that varies based on an input signal and the ramp signal;
- means for amplifying the plurality of PWM signals and providing a feedback signal to the means for providing the plurality of PWM signals; and
- means for transitioning the means for providing the plurality of PWM signals between at least two operation states based at least in part upon the ramp signal.

15. The system of claim 14, wherein the at least two operation states comprises an activated state and a deactivated state.

16. The system of claim 15, further comprising:
- means for detecting the operation state of the means for providing the plurality of PWM signals; and
- means for providing a reset signal to the means for transitioning in response to detecting the deactivated state.

17. A method for transitioning an output state of a modulator of an audio system between an activated output state and a deactivated output state, the method comprising:
- monitoring a selection signal, the selection signal indicating a change in the output state of the modulator;
- a ramp signal generating in response to detecting the selection signal indicating the change in the output state of the modulator; and
- varying a closed loop transfer function of the modulator as a function of the ramp signal.

18. The method of claim 17, wherein the modulator further comprises at least one variable time constant integrator, where in a time constant of the at least one variable time constant integrator varies as function of the ramp signal.

19. The method of claim 17, further comprising:
- detecting the output state the modulator; and
- varying a gain of the modulator to about zero in response to detecting the deactivated output state.

20. The method of claim 17, wherein the modulator defines at least part of a second order, two pole filter system, wherein a first pole of the second order, two pole filter system is dominant relative to a second pole of the second order, two pole filter system during an activated state, and the second pole of the second order, two pole filter system is dominant relative to the first pole of the second order, two pole filter system during a deactivated state.

* * * * *